(12) United States Patent
Hashimoto

(10) Patent No.: US 12,334,890 B2
(45) Date of Patent: Jun. 17, 2025

(54) TUNABLE DEVICE

(71) Applicant: Innolux Corporation, Miaoli County (TW)

(72) Inventor: Kazuyuki Hashimoto, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 18/401,697

(22) Filed: Jan. 1, 2024

(65) Prior Publication Data

US 2024/0421798 A1    Dec. 19, 2024

Related U.S. Application Data

(60) Provisional application No. 63/521,098, filed on Jun. 15, 2023.

(51) Int. Cl.
*H03H 11/02*    (2006.01)

(52) U.S. Cl.
CPC .................................. *H03H 11/02* (2013.01)

(58) Field of Classification Search
CPC .. H03H 11/02; H03H 2210/02; H03J 2200/10
USPC .................................. 327/113, 574; 333/24 C
See application file for complete search history.

(56) References Cited

U.S. PATENT DOCUMENTS

| | | | |
|---|---|---|---|
| 2023/0057176 A1* | 2/2023 | Esfahlani | H01Q 15/0066 |
| 2024/0178571 A1* | 5/2024 | Hashimoto | H01Q 3/2682 |
| 2024/0355244 A1* | 10/2024 | Hashimoto | H03J 3/02 |
| 2024/0372533 A1* | 11/2024 | Ting | H03J 3/185 |
| 2024/0373558 A1* | 11/2024 | Ting | H05K 1/181 |

* cited by examiner

*Primary Examiner* — William Hernandez
(74) *Attorney, Agent, or Firm* — JCIPRNET

(57) ABSTRACT

A tunable device is provided. The tunable device includes a plurality of tunable units. Each of the plurality of tunable units includes a driving circuit and a frequency tunable circuit. The frequency tunable circuit includes a tunable component. The control terminal of the tunable component is coupled to the driving circuit, and the driving circuit and the frequency tunable circuit are isolated in terms of a tuned frequency of the frequency tunable circuit.

19 Claims, 5 Drawing Sheets

TUNABLE DEVICE

CROSS-REFERENCE TO RELATED APPLICATION

This application claims the priority benefit of U.S. provisional application Ser. No. 63/521,098, filed on Jun. 15, 2023. The entirety of the above-mentioned patent application is hereby incorporated by reference herein and made a part of this specification.

BACKGROUND

Technical Field

The disclosure relates a device; particularly, the disclosure relates to a tunable device.

Description of Related Art

For a conventional tunable device operated at a resonance frequency, multiple circuits inside the tunable device are coupled to the same common voltage, which may cause signal interference, thereby degrading the performance of the tunable device.

SUMMARY

The tunable device of the disclosure includes a plurality of tunable units. Each of the plurality of tunable units includes a driving circuit and a frequency tunable circuit. The frequency tunable circuit includes a tunable component. The control terminal of the tunable component is coupled to the driving circuit, and the driving circuit and the frequency tunable circuit are isolated in terms of a tuned frequency of the frequency tunable circuit.

Based on the above, according to the tunable device of the disclosure, the driving circuit may effectively drive the frequency tunable circuit.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
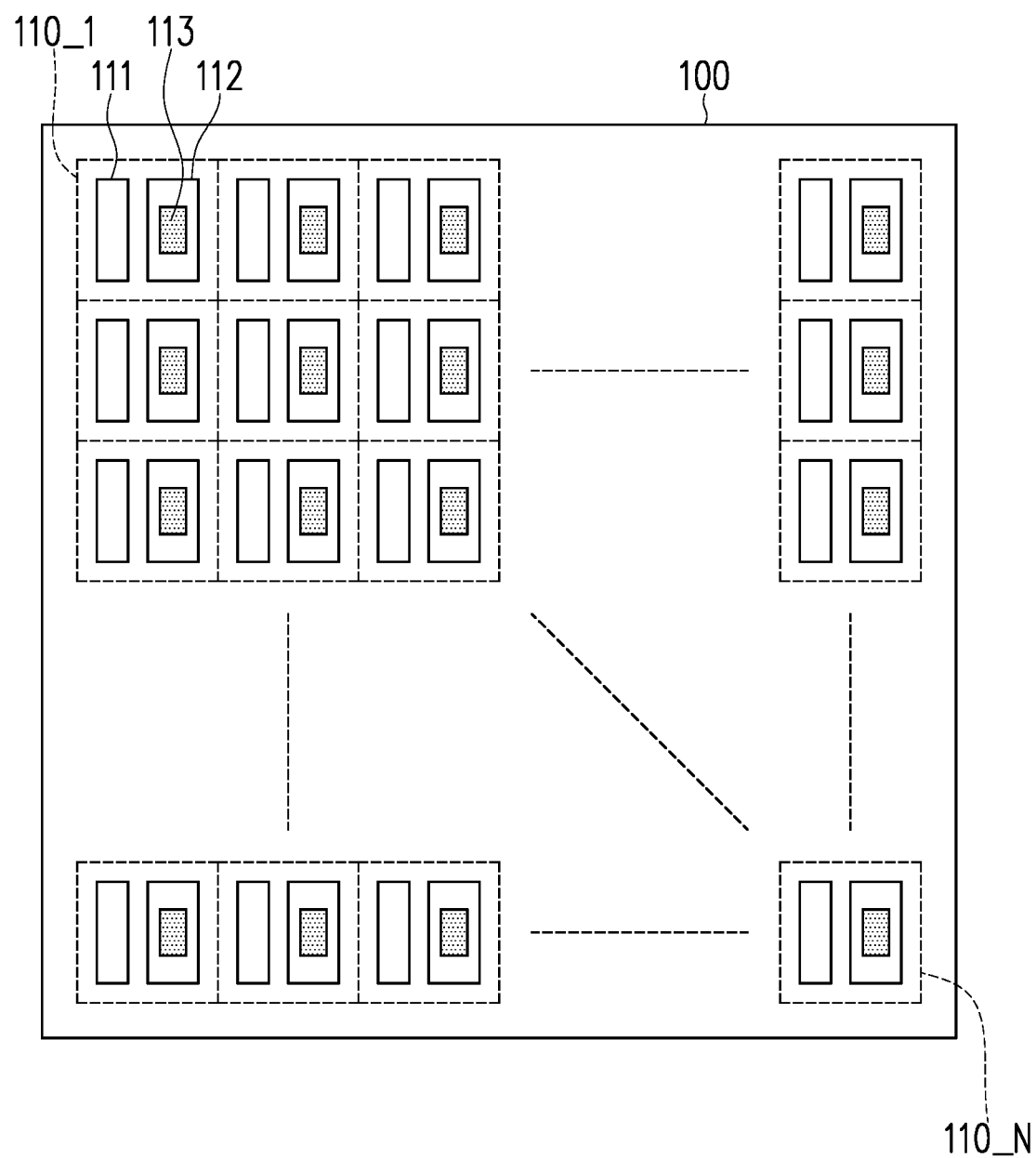
FIG. 1 is a circuit schematic diagram of a tunable device according to an embodiment of the disclosure.

Reference will now be made in detail to the exemplary embodiments of the disclosure, examples of which are illustrated in the accompanying drawings. Whenever possible, the same reference numbers are used in the drawings and the description to refer to the same or like components.

Certain terms are used throughout the specification and appended claims of the disclosure to refer to specific components. Those skilled in the art should understand that electronic device manufacturers may refer to the same components by different names. This article does not intend to distinguish those components with the same function but different names. In the following description and rights request, the words such as "comprise" and "include" are open-ended terms, and should be explained as "including but not limited to . . . ".

The term "coupling (or connection)" used throughout the whole specification of the present application (including the appended claims) may refer to any direct or indirect connection means. For example, if the text describes that a first device is coupled (or connected) to a second device, it should be interpreted that the first device may be directly connected to the second device, or the first device may be indirectly connected through other devices or certain connection means to be connected to the second device. The terms "first", "second", and similar terms mentioned throughout the whole specification of the present application (including the appended claims) are merely used to name discrete elements or to differentiate among different embodiments or ranges. Therefore, the terms should not be regarded as limiting an upper limit or a lower limit of the quantity of the elements and should not be used to limit the arrangement sequence of elements. In addition, wherever possible, elements/components/steps using the same reference numerals in the drawings and the embodiments represent the same or similar parts. Reference may be mutually made to related descriptions of elements/components/steps using the same reference numerals or using the same terms in different embodiments.

FIG. 1 is a circuit schematic diagram of a tunable device according to an embodiment of the disclosure. Referring to FIG. 1, a tunable device 100 includes a plurality of tunable units 110_1 to 110_N, and the tunable units 110_1 to 110_N may be arranged in an array as shown in FIG. 1, where N is a positive integer. Each of the tunable units 110_1 to 110_N includes a driving circuit 111 and a frequency tunable circuit 112. The frequency tunable circuit 112 includes a tunable component 113, and the driving circuit 111 is coupled to a control terminal of the tunable component 113.

In the embodiment of the disclosure, the frequency tunable circuit 112 may be a resonator. A resonance frequency of each frequency tunable circuit may be tuned by a control signal of each corresponding tunable component, and the each corresponding tunable component may be driven by the corresponding driving circuit. In one embodiment of the disclosure, the frequency tunable circuit 112 may be a filter. In the embodiment of the disclosure, the tunable component 113 may be a voltage-controlled component (e.g. a varactor), but the disclosure is not limited thereto. In one embodiment of the disclosure, the tunable component 113 may be a current-controlled component, a tunable capacitance component, a tunable inductance component or a tunable resistance component. In another embodiment of the disclosure, the tunable device 100 may be a beam-steerable directional antenna device, and the frequency tunable circuit 112 may be an antenna unit.

Figure 2:
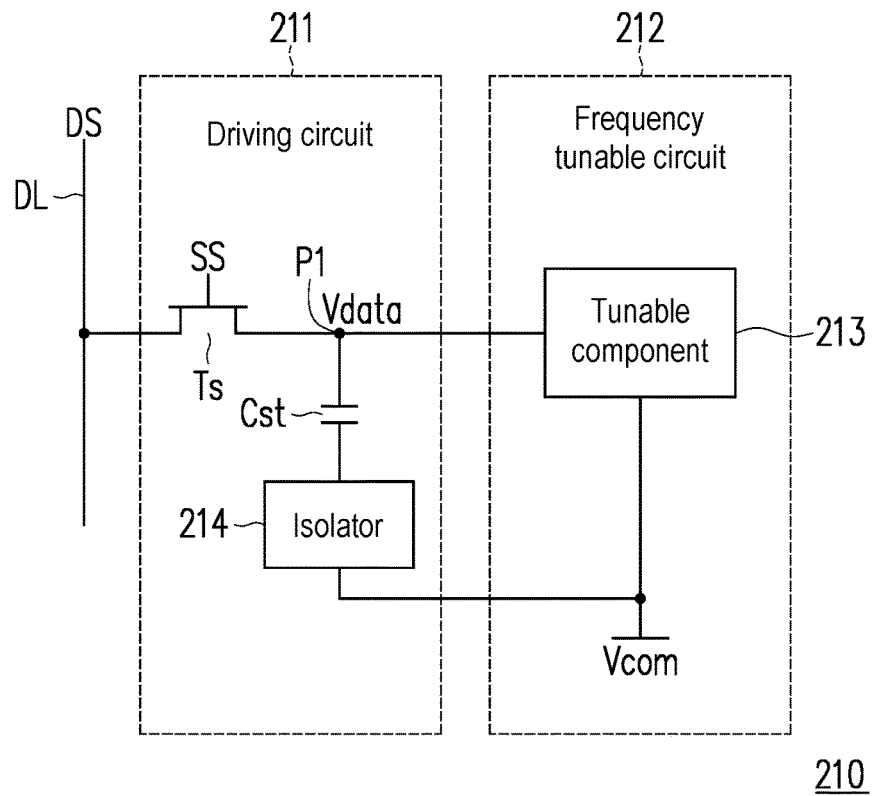
FIG. 2 is a circuit schematic diagram of a tunable unit according to an embodiment of the disclosure.

FIG. 2 is a circuit schematic diagram of a tunable unit according to an embodiment of the disclosure. Referring to FIG. 2, the circuit architecture of each of the tunable units 110_1 to 110_N of FIG. 1 may be implemented as a tunable unit 210 of FIG. 2. In the embodiment of the disclosure, the tunable unit 210 includes a driving circuit 211 and a frequency tunable circuit 212. The driving circuit 211 is coupled to a data line DL to receive a data signal DS. The driving circuit 211 is further coupled to the frequency tunable circuit 212. The frequency tunable circuit 212 includes a tunable component 213. The driving circuit 211 includes a scan transistor Ts, a capacitor Cst and an isolator 214.

In the embodiment of the disclosure, a first terminal of the scan transistor Ts is coupled to the data line DL. A second terminal of the scan transistor Ts is coupled to a first terminal of the capacitor Cst and a control terminal of the tunable component 213 through a circuit node P1. A control terminal of the scan transistor Ts is coupled to a scan line to receive a scan signal SS. The scan transistor Ts may be an n-type transistor (e.g. an n-type Metal-Oxide-Semiconductor (MOS) transistor). The first terminal of the scan transistor Ts may be a drain terminal, the second terminal of the scan transistor Ts may be a source terminal, and the control terminal of the scan transistor Ts may be a gate terminal. In one embodiment of the disclosure, the scan transistor Ts may be a p-type transistor (e.g. a p-type MOS transistor). In the embodiment of the disclosure, a second terminal of the capacitor Cst is coupled to a terminal of the tunable component 213 of the frequency tunable circuit 212 and a common voltage Vcom through the isolator 214. The terminal of the tunable component 213 is coupled to the common voltage Vcom. In the embodiment of the disclosure, the isolator 214 may be a resistor, but the disclosure is not limited thereto. In one embodiment of the disclosure, the isolator 214 may be an inductor.

In the embodiment of the disclosure, in response to the scan transistor Ts being turned-on by the scan signal SS, the scan transistor Ts transmits a data voltage Vdata to the capacitor Cst according to the data signal DS. The first terminal of the capacitor Cst is configured to hold the data voltage Vdata, so that the circuit node P1 may be maintained at the data voltage Vdata. In the embodiment of the disclosure, the capacitor Cst is configured to store the data voltage Vdata and output a control signal (i.e. a control voltage) corresponding to the data voltage Vdata to the control terminal of the tunable component 213, so that a tuned frequency (e.g. a tuned resonance frequency) of the frequency tunable circuit 212 may be tuned by the control signal. The frequency tunable circuit 212 may be operated at the tuned frequency.

It should be noted that, in the embodiment of sharing the common voltage Vcom, since the capacitor Cst of the driving circuit 211 is coupled to the frequency tunable circuit 212 through the isolator 214, the capacitor Cst does not form an additional signal path at the tuned frequency. Therefore, the driving circuit 211 may be effectively isolated from the frequency tunable circuit 212 at the tuned frequency. In the embodiment of disclosure, the resistor or the inductor functions as the isolator at the tuned frequency.

Figure 3:
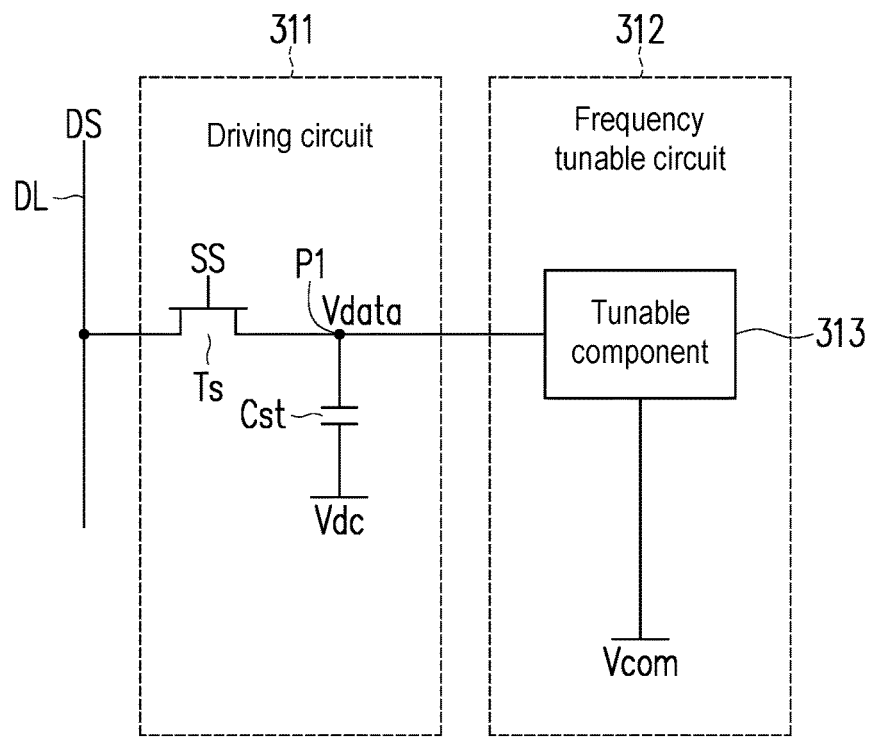
FIG. 3 is a circuit schematic diagram of a tunable unit according to an embodiment of the disclosure.

FIG. 3 is a circuit schematic diagram of a tunable unit according to an embodiment of the disclosure. Referring to FIG. 3, the circuit architecture of each of the tunable units 110_1 to 110_N of FIG. 1 may be implemented as a tunable unit 310 of FIG. 3. In the embodiment of the disclosure, the tunable unit 310 includes a driving circuit 311 and a frequency tunable circuit 312. The driving circuit 311 is coupled to a data line DL to receive a data signal DS. The driving circuit 311 is further coupled to the frequency tunable circuit 312. The frequency tunable circuit 312 includes a tunable component 313. The driving circuit 311 includes a scan transistor Ts and a capacitor Cst.

In the embodiment of the disclosure, a first terminal of the scan transistor Ts is coupled to the data line DL. A second terminal of the scan transistor Ts is coupled to a first terminal of the capacitor Cst and a control terminal of the tunable component 313 through a circuit node P1. In the embodiment of the disclosure, a second terminal of the capacitor Cst is coupled to an isolated constant direct current (DC) voltage Vdc. The terminal of the tunable component 313 is coupled to a common voltage Vcom.

In the embodiment of the disclosure, in response to the scan transistor Ts being turned-on by the scan signal SS, the scan transistor Ts transmits a data voltage Vdata to the capacitor Cst according to the data signal DS. The first terminal of the capacitor Cst is configured to hold the data voltage Vdata, so that the circuit node P1 may be maintained at the data voltage Vdata. In the embodiment of the disclosure, the capacitor Cst is configured to store the data voltage Vdata and output a control signal (i.e. a control voltage) corresponding to the data voltage Vdata to the control terminal of the tunable component 313, so that a tuned frequency (e.g. a tuned resonance frequency) of the frequency tunable circuit 312 may be tuned by the control signal. The frequency tunable circuit 312 may be operated at the tuned frequency.

It should be noted that, since the second terminal of the capacitor Cst of the driving circuit 311 is coupled to the isolated constant DC voltage Vdc instead of the common voltage Vcom, and the isolated constant DC voltage Vdc is isolated from the frequency tunable circuit 312 at the tuned frequency, the driving circuit 311 may be effectively isolated from the frequency tunable circuit 312 at the tuned frequency.

Figure 4:
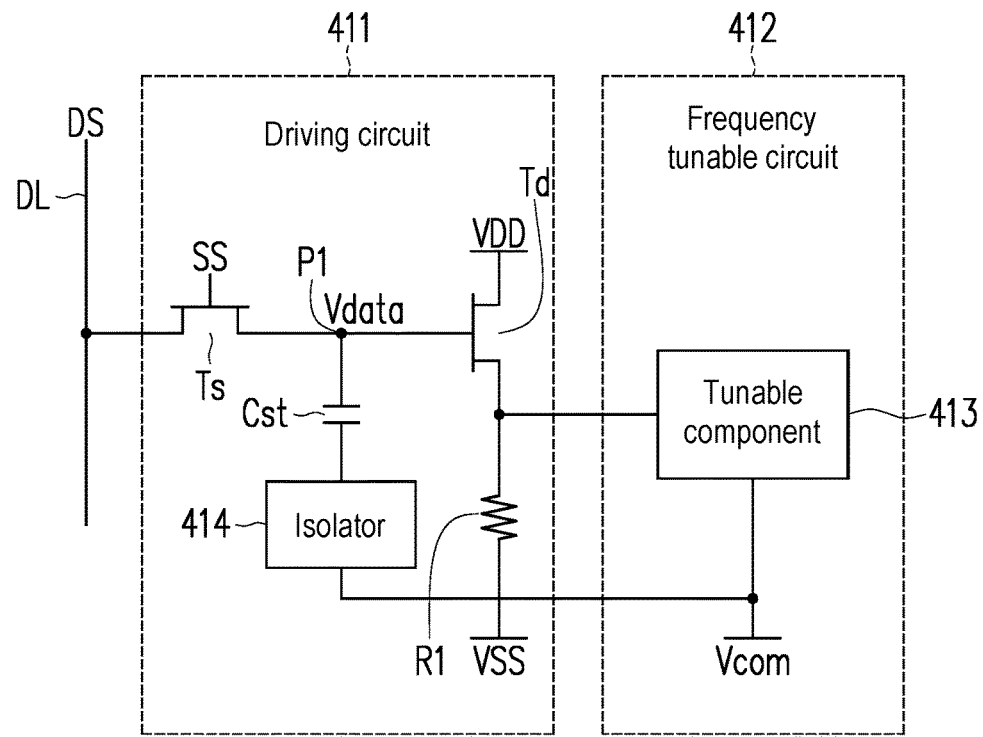
FIG. 4 is a circuit schematic diagram of a tunable unit according to an embodiment of the disclosure.

FIG. 4 is a circuit schematic diagram of a tunable unit according to an embodiment of the disclosure. Referring to FIG. 4, the circuit architecture of each of the tunable units 110_1 to 110_N of FIG. 1 may be implemented as a tunable unit 410 of FIG. 4. In the embodiment of the disclosure, the tunable unit 410 includes a driving circuit 411 and a frequency tunable circuit 412. The driving circuit 411 is coupled to a data line DL to receive a data signal DS. The driving circuit 411 is further coupled to the frequency tunable circuit 412. The frequency tunable circuit 412 includes a tunable component 413. The driving circuit 411 includes a scan transistor Ts, a capacitor Cst, an isolator 414, a driving transistor Td and a resistor R1.

In the embodiment of the disclosure, a first terminal of the scan transistor Ts is coupled to the data line DL. A second terminal of the scan transistor Ts is coupled to a first terminal of the capacitor Cst and a control terminal of the driving transistor Td through a circuit node P1. A control terminal of the scan transistor Ts is coupled to a scan line to receive a scan signal SS. A first terminal of the driving transistor Td is coupled to a first operation voltage VDD. A second terminal of the driving transistor Td is coupled to a control terminal of the tunable component 413 and a first terminal of the resistor R1. A second terminal of the resistor R1 is coupled to a second operation voltage VSS. The scan transistor Ts and the driving transistor Td may be n-type transistors (e.g. n-type MOS transistors). In one embodiment of the disclosure, the scan transistor Ts and the driving transistor Td may be p-type transistors (e.g. p-type MOS transistors).

In the embodiment of the disclosure, a second terminal of the capacitor Cst is coupled to a terminal of the tunable component 413 of the frequency tunable circuit 412 and a common voltage Vcom through the isolator 414. The terminal of the tunable component 413 is coupled to the common voltage Vcom. In the embodiment of the disclosure, the isolator 414 may be a resistor, but the disclosure is not limited thereto. In one embodiment of the disclosure, the isolator 414 may be an inductor.

In the embodiment of the disclosure, in response to the scan transistor Ts being turned-on by the scan signal SS, the scan transistor Ts transmits a data voltage Vdata to the capacitor Cst according to the data signal DS. The first terminal of the capacitor Cst is configured to hold the data voltage Vdata, so that the circuit node P1 may be maintained at the data voltage Vdata. In the embodiment of the disclosure, the capacitor Cst is configured to store the data voltage Vdata and apply the data voltage Vdata to the control terminal of the driving transistor Td. The driving transistor Td may be operated as a source follower amplifier, and the second terminal of the driving transistor Td may output a control signal (i.e. a control voltage) corresponding to the data voltage Vdata to the control terminal of the tunable component 413, so that a tuned frequency (e.g. a tuned resonance frequency) of the frequency tunable circuit 412 may be tuned by the control signal. The frequency tunable circuit 412 may be operated at the tuned frequency. In one embodiment of the disclosure, the driving circuit 411 may further include other transistors and/or other circuit units to form the source follower amplifier, and is not limited to the driving transistor Td as shown in FIG. 4.

It should be noted that, in the embodiment of sharing the common voltage Vcom, since the capacitor Cst of the driving circuit 411 is coupled to the frequency tunable circuit 412 through the isolator 414, the capacitor Cst does not form an additional signal path at the tuned frequency. Therefore, the driving circuit 411 may be effectively isolated from the frequency tunable circuit 412 at the tuned frequency. In the embodiment of disclosure, the resistor or the inductor functions as the isolator at the tuned frequency.

Figure 5:
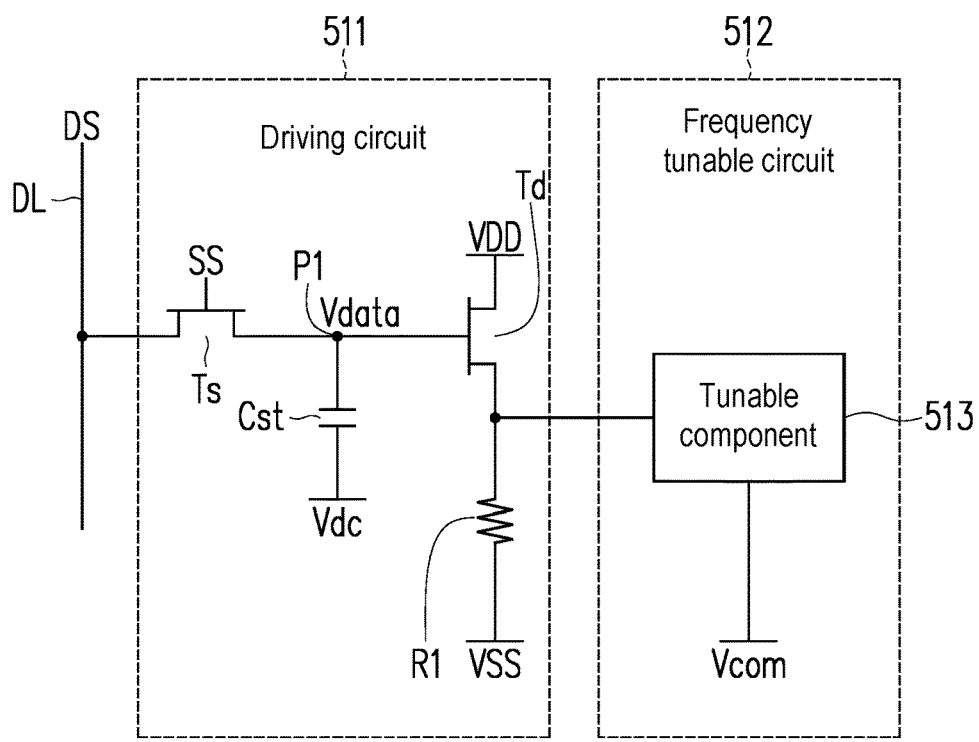
FIG. 5 is a circuit schematic diagram of a tunable unit according to an embodiment of the disclosure.

FIG. 5 is a circuit schematic diagram of a tunable unit according to an embodiment of the disclosure. Referring to FIG. 5, the circuit architecture of each of the tunable units 110_1 to 110_N of FIG. 1 may be implemented as a tunable unit 510 of FIG. 5. In the embodiment of the disclosure, the tunable unit 510 includes a driving circuit 511 and a frequency tunable circuit 512. The driving circuit 511 is coupled to a data line DL to receive a data signal DS. The driving circuit 511 is further coupled to the frequency tunable circuit 512. The frequency tunable circuit 512 includes a tunable component 513. The driving circuit 511 includes a scan transistor Ts, a capacitor Cst, a driving transistor Td and a resistor R1.

In the embodiment of the disclosure, a first terminal of the scan transistor Ts is coupled to the data line DL. A second terminal of the scan transistor Ts is coupled to a first terminal of the capacitor Cst and a control terminal of the driving transistor Td through a circuit node P1. A control terminal of the scan transistor Ts is coupled to a scan line to receive a scan signal SS. A first terminal of the driving transistor Td is coupled to a first operation voltage VDD. A second terminal of the driving transistor Td is coupled to a control terminal of the tunable component 513 and a first terminal of the resistor R1. A second terminal of the resistor R1 is coupled to a second operation voltage VSS. In the embodiment of the disclosure, a second terminal of the capacitor Cst is coupled to an isolated constant direct current (DC) voltage Vdc. The terminal of the tunable component 513 is coupled to a common voltage Vcom. In one embodiment of the disclosure, the isolated constant DC voltage Vdc may be equal to the first operation voltage VDD or the second operation voltage VSS, but the disclosure is not limited thereto.

In the embodiment of the disclosure, in response to the scan transistor Ts being turned-on by the scan signal SS, the scan transistor Ts transmits a data voltage Vdata to the capacitor Cst according to the data signal DS. The first terminal of the capacitor Cst is configured to hold the data voltage Vdata, so that the circuit node P1 may be maintained at the data voltage Vdata. In the embodiment of the disclosure, the capacitor Cst is configured to store the data voltage Vdata and apply the data voltage Vdata to the control terminal of the driving transistor Td. The driving transistor Td may be operated as a source follower amplifier, and the second terminal of the driving transistor Td may output a control signal (i.e. a control voltage) corresponding to the data voltage Vdata to the control terminal of the tunable component 513, so that a tuned frequency (e.g. a tuned resonance frequency) of the frequency tunable circuit 512 may be tuned by the control signal. The frequency tunable circuit 512 may be operated at the tuned frequency. In one embodiment of the disclosure, the driving circuit 511 may further include other transistors and/or other circuit units to form the source follower amplifier, and is not limited to the driving transistor Td as shown in FIG. 5.

It should be noted that, since the second terminal of the capacitor Cst of the driving circuit 511 is coupled to the isolated constant DC voltage Vdc instead of the common voltage Vcom, and the isolated constant DC voltage Vdc is isolated from the frequency tunable circuit 512 at the tuned frequency, the driving circuit 511 may be effectively isolated from the frequency tunable circuit 512 at the tuned frequency.

Figure 6:
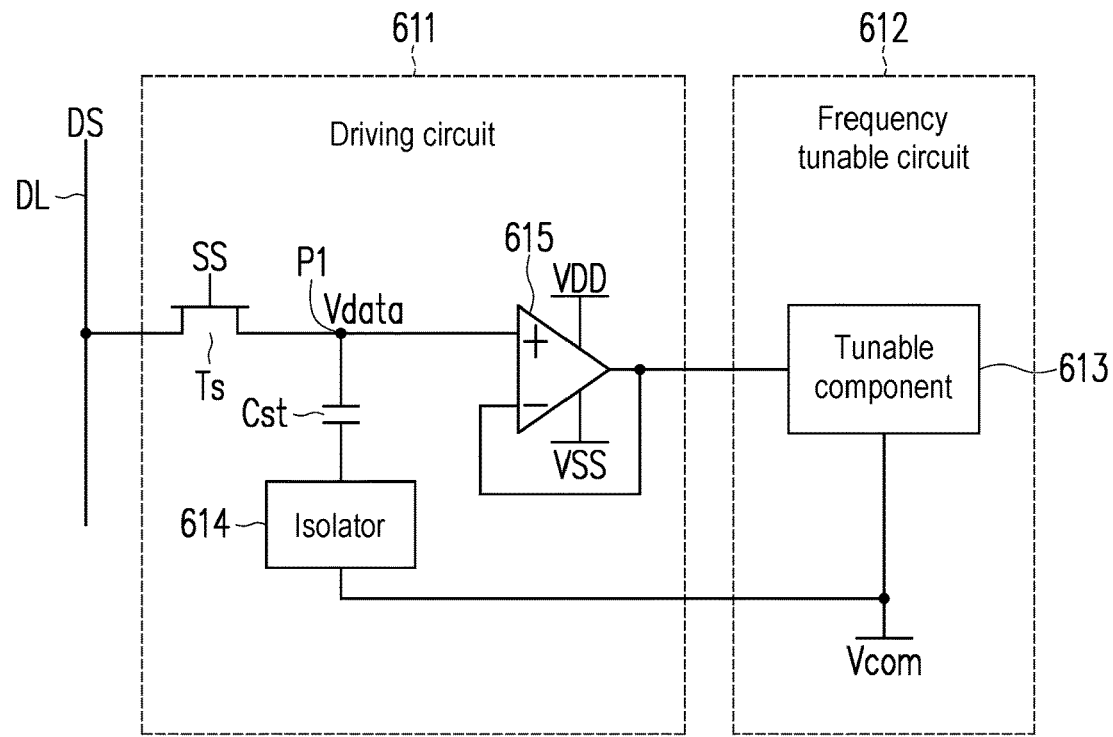
FIG. 6 is a circuit schematic diagram of a tunable unit according to an embodiment of the disclosure.

FIG. 6 is a circuit schematic diagram of a tunable unit according to an embodiment of the disclosure. Referring to FIG. 6, the circuit architecture of each of the tunable units 110_1 to 110_N of FIG. 1 may be implemented as a tunable unit 610 of FIG. 6. In the embodiment of the disclosure, the tunable unit 610 includes a driving circuit 611 and a frequency tunable circuit 612. The driving circuit 611 is coupled to a data line DL to receive a data signal DS. The driving circuit 611 is further coupled to the frequency tunable circuit 612. The frequency tunable circuit 612 includes a tunable component 613. The driving circuit 611 includes a scan transistor Ts, a capacitor Cst, an isolator 614 and an operational amplifier 615.

In the embodiment of the disclosure, a first terminal of the scan transistor Ts is coupled to the data line DL. A second terminal of the scan transistor Ts is coupled to a first terminal of the capacitor Cst and a first input terminal (i.e. a non-inverting input terminal) of the operational amplifier 615 through a circuit node P1. A control terminal of the scan transistor Ts is coupled to a scan line to receive a scan signal SS. A second input terminal (i.e. an inverting input terminal) of the operational amplifier 615 is coupled to an output terminal of the operational amplifier 615. The operational amplifier 615 is further coupled between a first operation voltage VDD and a second operation voltage VSS, so as to be operated between the first operation voltage VDD and the second operation voltage VSS. The scan transistor Ts may be an n-type transistor (e.g. an n-type MOS transistor). In one embodiment of the disclosure, the scan transistor Ts may be a p-type transistor (e.g. a p-type MOS transistor).

In the embodiment of the disclosure, a second terminal of the capacitor Cst is coupled to a terminal of the tunable component 613 of the frequency tunable circuit 612 and a common voltage Vcom through the isolator 614. The terminal of the tunable component 613 is coupled to the common voltage Vcom. In the embodiment of the disclosure, the isolator 614 may be a resistor, but the disclosure is not limited thereto. In one embodiment of the disclosure, the isolator 614 may be an inductor.

In the embodiment of the disclosure, in response to the scan transistor Ts being turned-on by the scan signal SS, the scan transistor Ts transmits a data voltage Vdata to the capacitor Cst according to the data signal DS. The first terminal of the capacitor Cst is configured to hold the data voltage Vdata, so that the circuit node P1 may be maintained at the data voltage Vdata. In the embodiment of the disclosure, the capacitor Cst is configured to store the data voltage Vdata and provide the data voltage Vdata to the first input terminal of operational amplifier 615. The output terminal of operational amplifier 615 may output a control signal (i.e. a control voltage) corresponding to the data voltage Vdata to the control terminal of the tunable component 613, so that a tuned frequency (e.g. a tuned resonance frequency) of the frequency tunable circuit 612 may be tuned by the control signal. The frequency tunable circuit 612 may be operated at the tuned frequency.

It should be noted that, in the embodiment of sharing the common voltage Vcom, since the capacitor Cst of the driving circuit 611 is coupled to the frequency tunable circuit 612 through the isolator 614, the capacitor Cst does not form an additional signal path at the tuned frequency. Therefore, the driving circuit 611 may be effectively isolated from the frequency tunable circuit 612 at the tuned frequency. In the embodiment of disclosure, the resistor or the inductor functions as the isolator at the tuned frequency.

Figure 7:
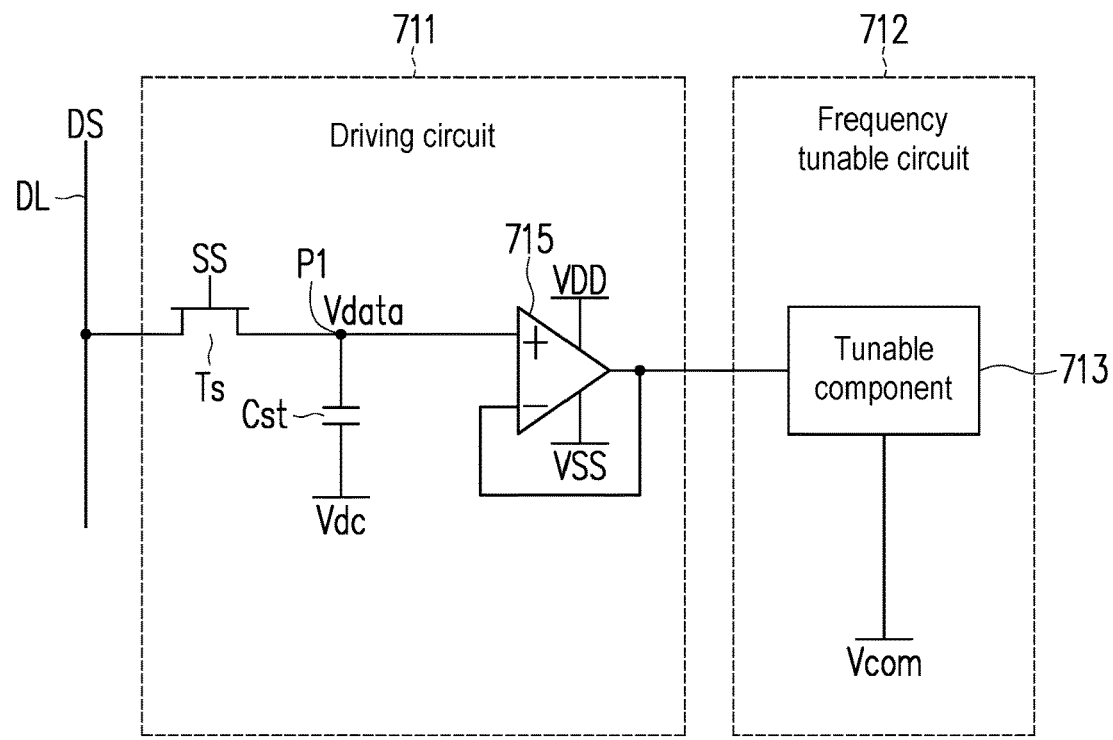
FIG. 7 is a circuit schematic diagram of a tunable unit according to an embodiment of the disclosure.

FIG. 7 is a circuit schematic diagram of a tunable unit according to an embodiment of the disclosure. Referring to FIG. 7, the circuit architecture of each of the tunable units 110_1 to 110_N of FIG. 1 may be implemented as a tunable unit 710 of FIG. 7. In the embodiment of the disclosure, the tunable unit 710 includes a driving circuit 711 and a frequency tunable circuit 712. The driving circuit 711 is coupled to a data line DL to receive a data signal DS. The driving circuit 711 is further coupled to the frequency tunable circuit 712. The frequency tunable circuit 712 includes a tunable component 713. The driving circuit 711 includes a scan transistor Ts, a capacitor Cst and an operational amplifier 715.

In the embodiment of the disclosure, a first terminal of the scan transistor Ts is coupled to the data line DL. A second terminal of the scan transistor Ts is coupled to a first terminal of the capacitor Cst and a first input terminal (i.e. non-inverting input terminal) of the operational amplifier 715 through a circuit node P1. A control terminal of the scan transistor Ts is coupled to a scan line to receive a scan signal SS. A second input terminal (i.e. inverting input terminal) of the operational amplifier 715 is coupled to an output terminal of the operational amplifier 715. The operational amplifier 715 is further coupled between a first operation voltage VDD and a second operation voltage VSS, so as to be operated between the first operation voltage VDD and the second operation voltage VSS. In the embodiment of the disclosure, a second terminal of the capacitor Cst is coupled to an isolated constant direct current (DC) voltage Vdc. The terminal of the tunable component 713 is coupled to a common voltage Vcom. In one embodiment of the disclosure, the isolated constant DC voltage Vdc may be equal to the first operation voltage VDD or the second operation voltage VSS, but the disclosure is not limited thereto.

In the embodiment of the disclosure, in response to the scan transistor Ts being turned-on by the scan signal SS, the scan transistor Ts transmits a data voltage Vdata to the capacitor Cst according to the data signal DS. The first terminal of the capacitor Cst is configured to hold the data voltage Vdata, so that the circuit node P1 may be maintained at the data voltage Vdata. In the embodiment of the disclosure, the capacitor Cst is configured to store the data voltage Vdata and provide the data voltage Vdata to the first input terminal of operational amplifier 715. The output terminal of operational amplifier 715 may output a control signal (i.e. a control voltage) corresponding to the data voltage Vdata to the control terminal of the tunable component 713, so that a tuned frequency (e.g. a tuned resonance frequency) of the frequency tunable circuit 712 may be tuned by the control signal. The frequency tunable circuit 712 may be operated at the tuned frequency.

It should be noted that, since the second terminal of the capacitor Cst of the driving circuit 711 is coupled to the isolated constant DC voltage Vdc instead of the common voltage Vcom, and the isolated constant DC voltage Vdc is isolated from the frequency tunable circuit 712 at the tuned frequency, the driving circuit 711 may be effectively isolated from the frequency tunable circuit 712 at the tuned frequency.

Figure 8:
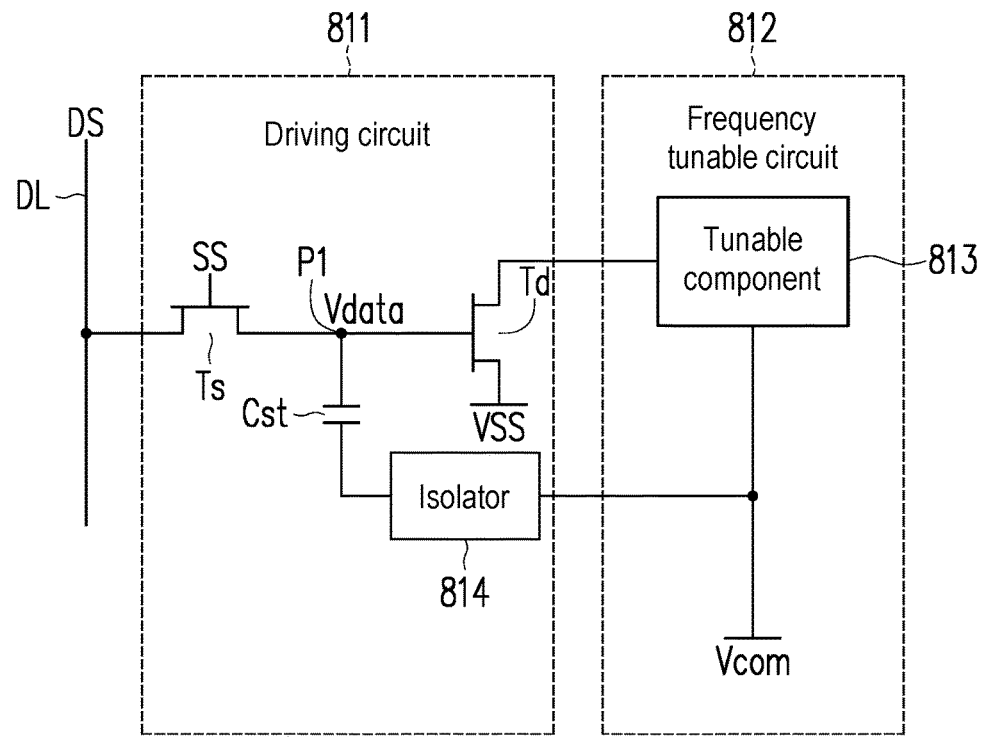
FIG. 8 is a circuit schematic diagram of a tunable unit according to an embodiment of the disclosure.

FIG. 8 is a circuit schematic diagram of a tunable unit according to an embodiment of the disclosure. Referring to FIG. 8, the circuit architecture of each of the tunable units 110_1 to 110_N of FIG. 1 may be implemented as a tunable unit 810 of FIG. 8. In the embodiment of the disclosure, the tunable unit 810 includes a driving circuit 811 and a frequency tunable circuit 812. The driving circuit 811 is coupled to a data line DL to receive a data signal DS. The driving circuit 811 is further coupled to the frequency tunable circuit 812. The frequency tunable circuit 812 includes a tunable component 813. The driving circuit 811 includes a scan transistor Ts, a capacitor Cst, an isolator 814 and a driving transistor Td.

In the embodiment of the disclosure, a first terminal of the scan transistor Ts is coupled to the data line DL. A second terminal of the scan transistor Ts is coupled to a first terminal of the capacitor Cst and a control terminal of the driving transistor Td through a circuit node P1. A control terminal of the scan transistor Ts is coupled to a scan line to receive a scan signal SS. A first terminal of the driving transistor Td is coupled to a control terminal of the tunable component 813. A second terminal of the driving transistor Td is coupled to a second operation voltage VSS. The scan transistor Ts and the driving transistor Td may be n-type transistors (e.g. n-type MOS transistors). In one embodiment of the disclosure, the scan transistor Ts and the driving transistor Td may be p-type transistors (e.g. p-type MOS transistors).

In the embodiment of the disclosure, a second terminal of the capacitor Cst is coupled to a terminal of the tunable component 813 of the frequency tunable circuit 812 and a common voltage Vcom through the isolator 814. The terminal of the tunable component 813 is coupled to the common voltage Vcom. In the embodiment of the disclosure, the isolator 814 may be a resistor, but the disclosure is not limited thereto. In one embodiment of the disclosure, the isolator 814 may be an inductor.

In the embodiment of the disclosure, in response to the scan transistor Ts being turned-on by the scan signal SS, the scan transistor Ts transmits a data voltage Vdata to the capacitor Cst according to the data signal DS. The first terminal of the capacitor Cst is configured to hold the data voltage Vdata, so that the circuit node P1 may be maintained at the data voltage Vdata. In the embodiment of the disclosure, the capacitor Cst is configured to store the data voltage Vdata and apply the data voltage Vdata to the control terminal of the driving transistor Td. The driving transistor Td may be configured as a current driver. The driving transistor Td may generate a control signal (i.e. a control current) corresponding to the data voltage Vdata, thus the control terminal of the tunable component 813 may receive the control signal from the first terminal of the driving transistor Td, so that a tuned frequency (e.g. a tuned resonance frequency) of the frequency tunable circuit 812 may be tuned by the control signal. The frequency tunable circuit 812 may be operated at the tuned frequency. In one embodiment of the disclosure, the driving circuit 811 may further include other transistors and/or other circuit units to form the current driver, and is not limited to the driving transistor Td as shown in FIG. 8.

It should be noted that, in the embodiment of sharing the common voltage Vcom, since the capacitor Cst of the driving circuit 811 is coupled to the frequency tunable circuit 812 through the isolator 814, the capacitor Cst does not form an additional signal path at the tuned frequency. Therefore, the driving circuit 811 may be effectively isolated from the frequency tunable circuit 812 at the tuned frequency. In the embodiment of disclosure, the resistor or the inductor functions as the isolator at the tuned frequency.

Figure 9:
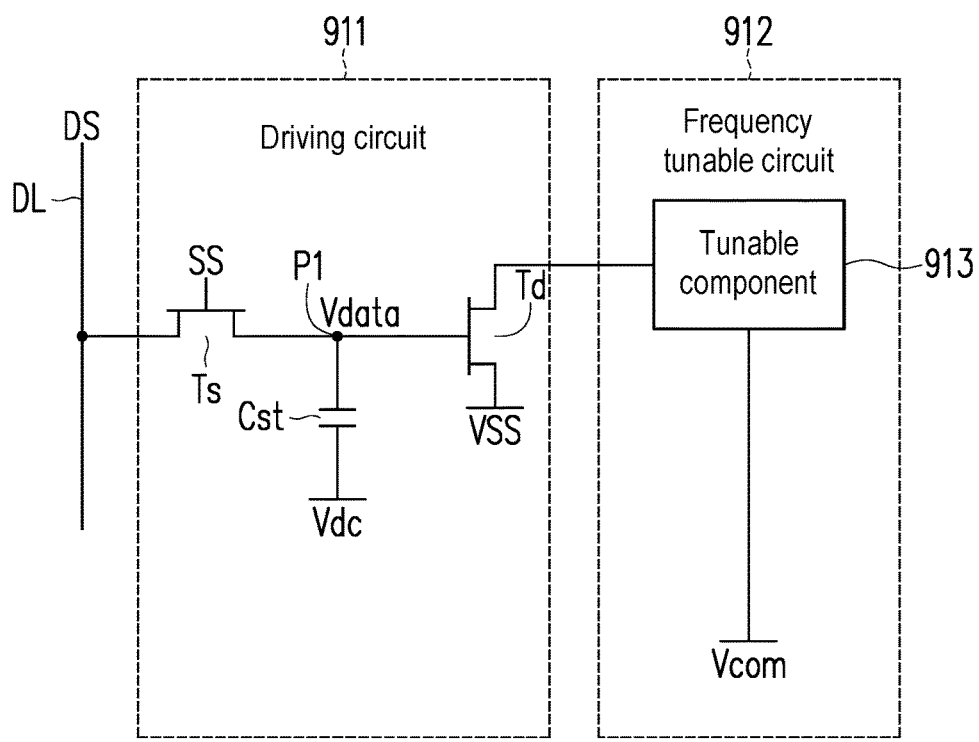
FIG. 9 is a circuit schematic diagram of a tunable unit according to an embodiment of the disclosure.

FIG. 9 is a circuit schematic diagram of a tunable unit according to an embodiment of the disclosure. Referring to FIG. 9, the circuit architecture of each of the tunable units 110_1 to 110_N of FIG. 1 may be implemented as a tunable unit 910 of FIG. 9. In the embodiment of the disclosure, the tunable unit 910 includes a driving circuit 911 and a frequency tunable circuit 912. The driving circuit 911 is coupled to a data line DL to receive a data signal DS. The driving circuit 911 is further coupled to the frequency tunable circuit 912. The frequency tunable circuit 912 includes a tunable component 913. The driving circuit 911 includes a scan transistor Ts, a capacitor Cst and a driving transistor Td.

In the embodiment of the disclosure, a first terminal of the scan transistor Ts is coupled to the data line DL. A second terminal of the scan transistor Ts is coupled to a first terminal of the capacitor Cst and a control terminal of the driving transistor Td through a circuit node P1. A control terminal of the scan transistor Ts is coupled to a scan line to receive a scan signal SS. A first terminal of the driving transistor Td is coupled to a control terminal of the tunable component 913. A second terminal of the driving transistor Td is coupled to a second operation voltage VSS. In the embodiment of the disclosure, a second terminal of the capacitor Cst is coupled to an isolated constant direct current (DC) voltage Vdc. The terminal of the tunable component 913 is coupled to a common voltage Vcom. In one embodiment of the disclosure, the isolated constant DC voltage Vdc may be equal to the second operation voltage VSS, but the disclosure is not limited thereto.

In the embodiment of the disclosure, in response to the scan transistor Ts being turned-on by the scan signal SS, the scan transistor Ts transmits a data voltage Vdata to the capacitor Cst according to the data signal DS. The first terminal of the capacitor Cst is configured to hold the data voltage Vdata, so that the circuit node P1 may be maintained at the data voltage Vdata. In the embodiment of the disclosure, the capacitor Cst is configured to store the data voltage Vdata and apply the data voltage Vdata to the control terminal of the driving transistor Td. The driving transistor Td may be configured as a current driver. The driving transistor Td may generate a control signal (i.e. a control current) corresponding to the data voltage Vdata, thus the control terminal of the tunable component 913 may receive the control signal from the first terminal of the driving transistor Td, so that a tuned frequency (e.g. a tuned resonance frequency) of the frequency tunable circuit 912 may be tuned by the control signal. The frequency tunable circuit 912 may be operated at the tuned frequency. In one embodiment of the disclosure, the driving circuit 911 may further include other transistors and/or other circuit units to form the current driver, and is not limited to the driving transistor Td as shown in FIG. 9.

It should be noted that, since the second terminal of the capacitor Cst of the driving circuit 911 is coupled to the isolated constant DC voltage Vdc instead of the common voltage Vcom, and the isolated constant DC voltage Vdc is isolated from the frequency tunable circuit 912 at the tuned frequency, the driving circuit 911 may be effectively isolated from the frequency tunable circuit 912 at the tuned frequency.

In summary, the tunable device of the disclosure may have a good resonant signal isolation between the driving circuit and the frequency tunable circuit at the tuned frequency, so that the driving circuit ma effectively drive the frequency tunable circuit.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A tunable device, comprising:
 a plurality of tunable units, wherein each of the plurality of tunable units comprises:
 a driving circuit; and
 a frequency tunable circuit, comprising a tunable component,
 wherein a control terminal of the tunable component is coupled to the driving circuit,
 wherein the driving circuit is isolated from the frequency tunable circuit at a tuned frequency.

2. The tunable device according to claim 1, wherein the driving circuit comprises:
 a capacitor, configured to store a data voltage and output a control signal corresponding to the data voltage to the tunable component.

3. The tunable device according to claim 2, wherein a first terminal of the capacitor is configured to hold the data voltage.

4. The tunable device according to claim 2, wherein a second terminal of the capacitor is coupled to an isolated constant direct current (DC) voltage.

5. The tunable device according to claim 2, wherein a second terminal of the capacitor is coupled to the frequency tunable circuit through an isolator.

6. The tunable device according to claim 5, wherein the isolator is a resistor.

7. The tunable device according to claim 5, wherein the isolator is an inductor.

8. The tunable device according to claim 2, wherein the driving circuit further comprises:
   a scan transistor, coupled to the capacitor, and configured to transmit the data voltage to the capacitor.

9. The tunable device according to claim 8, wherein the scan transistor is further coupled to a data line and a scan line.

10. The tunable device according to claim 2, wherein the driving circuit comprises a source follower amplifier.

11. The tunable device according to claim 2, wherein the driving circuit comprises an operational amplifier.

12. The tunable device according to claim 2, wherein the driving circuit comprises a current driver.

13. The tunable device according to claim 1, wherein the frequency tunable circuit is a resonator.

14. The tunable device according to claim 1, wherein the frequency tunable circuit is a filter.

15. The tunable device according to claim 1, wherein the tunable component is a voltage-controlled component.

16. The tunable device according to claim 1, wherein the tunable component is a current-controlled component.

17. The tunable device according to claim 1, wherein the tunable component is a tunable capacitance component.

18. The tunable device according to claim 1, wherein the tunable component is a tunable inductance component.

19. The tunable device according to claim 1, wherein the tunable component is a tunable resistance component.

\* \* \* \* \*